(12) United States Patent
Potter et al.

(10) Patent No.: US 11,521,872 B2
(45) Date of Patent: Dec. 6, 2022

(54) METHOD AND APPARATUS FOR MEASURING EROSION AND CALIBRATING POSITION FOR A MOVING PROCESS KIT

(71) Applicant: Applied Materials, Inc., Santa Clara, CA (US)

(72) Inventors: Charles G. Potter, Santa Clara, CA (US); Eli Mor, Garden City, ID (US); Sergio Lopez Carbajal, Dos Palos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 664 days.

(21) Appl. No.: 16/545,827

(22) Filed: Aug. 20, 2019

(65) Prior Publication Data

US 2020/0075367 A1 Mar. 5, 2020

Related U.S. Application Data

(60) Provisional application No. 62/726,892, filed on Sep. 4, 2018.

(51) Int. Cl.
  *H01L 21/67* (2006.01)
  *H01L 21/68* (2006.01)
  *G01D 5/14* (2006.01)

(52) U.S. Cl.
  CPC ...... *H01L 21/67253* (2013.01); *H01L 21/681* (2013.01); *G01D 5/14* (2013.01)

(58) Field of Classification Search
  CPC . H01L 21/67; H01L 21/67253; H01L 21/681; H01L 21/67259; H01L 21/682;
  (Continued)

(56) References Cited

U.S. PATENT DOCUMENTS 6,499,367 B1 12/2002 Saeki
7,778,793 B2 8/2010 Bonciolini et al.
(Continued)

FOREIGN PATENT DOCUMENTS

EP 1669808 A2 6/2007
JP 4956328 B2 6/2012
(Continued)

OTHER PUBLICATIONS

International Search Report and Written Opinion from International Application No. PCT/US2019/047983 dated Dec. 13, 2019, 12 pgs.

(Continued)

*Primary Examiner* — Son T Le
(74) *Attorney, Agent, or Firm* — Schwabe, Williamson & Wyatt, P.C.

(57) ABSTRACT

Embodiments disclosed herein include a method of calibrating a processing chamber. In an embodiment, the method comprises placing a sensor wafer onto a support surface in the processing chamber, wherein a process kit displaceable in the Z-direction is positioned around the support surface. In an embodiment, the method further comprises measuring a first gap distance between the sensor wafer and the process kit with a sensor on an edge surface of the sensor wafer. In an embodiment, the method further comprises displacing the process kit in the Z-direction. In an embodiment, the method further comprises measuring an additional gap distance between the sensor wafer and the process kit.

16 Claims, 8 Drawing Sheets

(58) Field of Classification Search
CPC ..... H01L 21/6831; H01L 22/10; H01L 22/20; H01L 22/30; G01D 5/14; G01B 7/14
See application file for complete search history.

(56) References Cited

U.S. PATENT DOCUMENTS

| | | | |
|---|---|---|---|
| 7,804,306 B2 | 9/2010 | Gardner et al. | |
| 8,224,607 B2 * | 7/2012 | Sakhare | G01B 11/03 702/95 |
| 9,903,739 B2 | 2/2018 | Sugita et al. | |
| 2007/0046284 A1 | 3/2007 | Renken et al. | |
| 2007/0222462 A1 | 9/2007 | Gardner et al. | |
| 2008/0231291 A1 | 9/2008 | Ramsey et al. | |
| 2008/0246493 A1 | 10/2008 | Gardner | |
| 2011/0074341 A1 | 3/2011 | Jensen et al. | |
| 2011/0193573 A1 | 8/2011 | De Boer et al. | |
| 2012/0304928 A1 | 12/2012 | Koelmel et al. | |
| 2013/0029433 A1 | 1/2013 | Sun et al. | |
| 2016/0141154 A1 | 5/2016 | Kamata et al. | |
| 2016/0211166 A1 | 7/2016 | Yan et al. | |
| 2016/0220172 A1 | 8/2016 | Sarrafzadeh et al. | |
| 2016/0363433 A1 | 12/2016 | Sugita et al. | |
| 2017/0032987 A1 | 2/2017 | Lee et al. | |
| 2017/0131217 A1 | 5/2017 | Tedeschi et al. | |
| 2018/0114681 A1 | 4/2018 | Jensen et al. | |
| 2018/0240694 A1 | 8/2018 | Adderly et al. | |

FOREIGN PATENT DOCUMENTS

| | | |
|---|---|---|
| JP | 2017003557 A | 1/2017 |
| JP | 2017-228754 | 12/2017 |
| KR | 10-2009-0022153 | 3/2009 |
| KR | 10-2016-0088820 | 7/2016 |
| KR | 10-2016-0146574 | 12/2016 |
| KR | 1020170014384 A | 2/2017 |
| KR | 101841607 B1 | 3/2018 |
| TW | 2017/16774 | 5/2017 |

OTHER PUBLICATIONS

International Preliminary Report on Patentability from Patent Application No. PCT/US2019/047983 dated Mar. 18, 2021, 8 pgs.
Official Letter from Taiwan Patent Application No. 108131808 dated Oct. 20, 2020, 17 pgs.
Preliminary Rejection from Korean Patent Application No. 10-2021-7002761 dated May 2, 2022, 9 pgs.
International Search Report and Written Opinion from PCT/US2019/044755 dated Nov. 20, 2019, 13 pgs.
International Search Report and Written Opinion from PCT/US2019/047535 dated Dec. 10, 2019, 10 pgs.
International Search Report and Written Opinion from PCT/US2019/047752 dated Dec. 10, 2019, 12 pgs.
International Search Report and Written Opinion from PCT/US2019/047983 dated Dec. 13, 2019, 12 pgs.
International Search Report and the Written Opinion from PCT/US2019/044524 dated Dec. 20, 2019, 10 pgs.

* cited by examiner

METHOD AND APPARATUS FOR MEASURING EROSION AND CALIBRATING POSITION FOR A MOVING PROCESS KIT

CROSS REFERENCE TO RELATED APPLICATIONS

This application claims priority to U.S. Provisional Application No. 62/726,892, filed on Sep. 4, 2018, the entire contents of which are hereby incorporated by reference herein.

BACKGROUND

1) Field

Embodiments relate to the field of semiconductor manufacturing and, in particular, to methods and apparatuses for measuring the position and erosion of a moving process kit.

2) Description of Related Art

In the processing of substrates, such as semiconducting wafers, a substrate is placed on a support surface (e.g., an electrostatic chuck (ESC)) in a processing chamber. Typically, a process kit is placed around the support surface to provide desired processing characteristics during substrate processing. For example, the process kit may be used to help shape the plasma in a plasma chamber in order to provide a more uniform process across the wafer. As such, it is often necessary to control the positioning of the top surface of the process kit relative to a top surface of the substrate being processed in order to achieve a desired processing outcome.

After installation of the process kit, various tests, such as etch rate tests or particle tests may be implemented to confirm the process kit is adequately positioned with respect to processed substrates. However, such test are expensive and can take hours to complete. Furthermore, the process kit may be eroded during processing of substrates. As such, the process kit may need to be adjusted in order to reset the relationship between substrate surfaces and the top surface of the process kit. Currently, erosion rates are not adequately defined and adjustments may not be made until after observable defects are found on the processed substrates.

SUMMARY

Embodiments disclosed herein include a method of calibrating a processing chamber. In an embodiment, the method comprises placing a sensor wafer onto a support surface in the processing chamber, wherein a process kit displaceable in the Z-direction is positioned around the support surface. In an embodiment, the method further comprises measuring a first gap distance between the sensor wafer and the process kit with a sensor on an edge surface of the sensor wafer. In an embodiment, the method further comprises displacing the process kit in the Z-direction. In an embodiment, the method further comprises measuring an additional gap distance between the sensor wafer and the process kit.

Embodiments disclosed herein include a method for measuring erosion of a process kit. In an embodiment, the method comprises placing a sensor wafer on a support surface in a processing tool. In an embodiment, the method further comprises aligning a top surface of a process kit surrounding the support surface to a top surface of sensor wafer using sensors on the sensor wafer. In an embodiment, the method further comprises removing the sensor wafer from the support surface. In an embodiment, the method further comprises processing one or more device substrates in the processing tool. In an embodiment, the method further comprises placing a sensor wafer on the support surface. In an embodiment, the method further comprises measuring a gap distance between the sensor wafer and the process kit with a sensor on an edge surface of the sensor wafer. In an embodiment, the method further comprises displacing the process kit in the Z-direction. In an embodiment, the method further comprises measuring the gap distance between the sensor wafer and the process kit a second time. In an embodiment, the method further comprises repeating the operations of displacing the process kit and measuring the gap distance until successive gap distance measurements are equal to each other.

Embodiments disclosed herein include a sensor wafer. In an embodiment, the sensor wafer comprises a substrate having a first surface and a second surface opposite the first surface, the first and second surface connected by an edge surface. In an embodiment, the sensor wafer further comprises a plurality of sensors around a perimeter of the substrate, wherein each of the sensors are outwardly facing position sensors.

DETAILED DESCRIPTION

Systems that include sensor wafers with edge sensors and methods of using such sensor wafers to measure the positioning of a process kit relative to the sensor wafer are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, in order to confirm that the process kit is properly positioned relative to substrates, a plurality of substrates are processed in the processing tool to monitor etch rates and/or to run particle tests. Only after many substrates are processed will it be possible to confirm that the process kit is properly aligned to provide a desired processing outcome. This process requires hours of down time for the processing tool and is expensive.

Accordingly, embodiments disclosed herein include a sensor wafer that is capable of measuring the process kit directly. In an embodiment, the sensor wafer may be used to confirm that a top surface of the process kit is substantially coplanar with a top surface of the sensor wafer. Since the sensor wafer may have substantially the same form factor as wafers processed in the chamber, the measurement of the process kit relative to the sensor wafer provides a close enough approximation to the position of a production wafer relative to the process kit. As such, a single test procedure may be implemented after pump-down of the processing tool in order to confirm that the process kit is positioned relative to production wafers to the needed tolerance. Accordingly, the time to calibrate the processing tool is reduced, and throughput capacity of the processing tool may be increased.

As the process kit is used in the manufacture of semiconductor devices, the processing environment may result in the erosion of the process kit, and the desired relationship between the process kit and the device wafers may drift. Accordingly, embodiments include a sensor wafer that may also be used in order to detect an erosion rate of the process kit. After an erosion rate is determined using a sensor wafer, the process kit may subsequently be adjusted to account for predicted erosion without needing to recalibrate the processing tool. As such, throughput capacity of a processing tool may be increased.

Figure 1A:
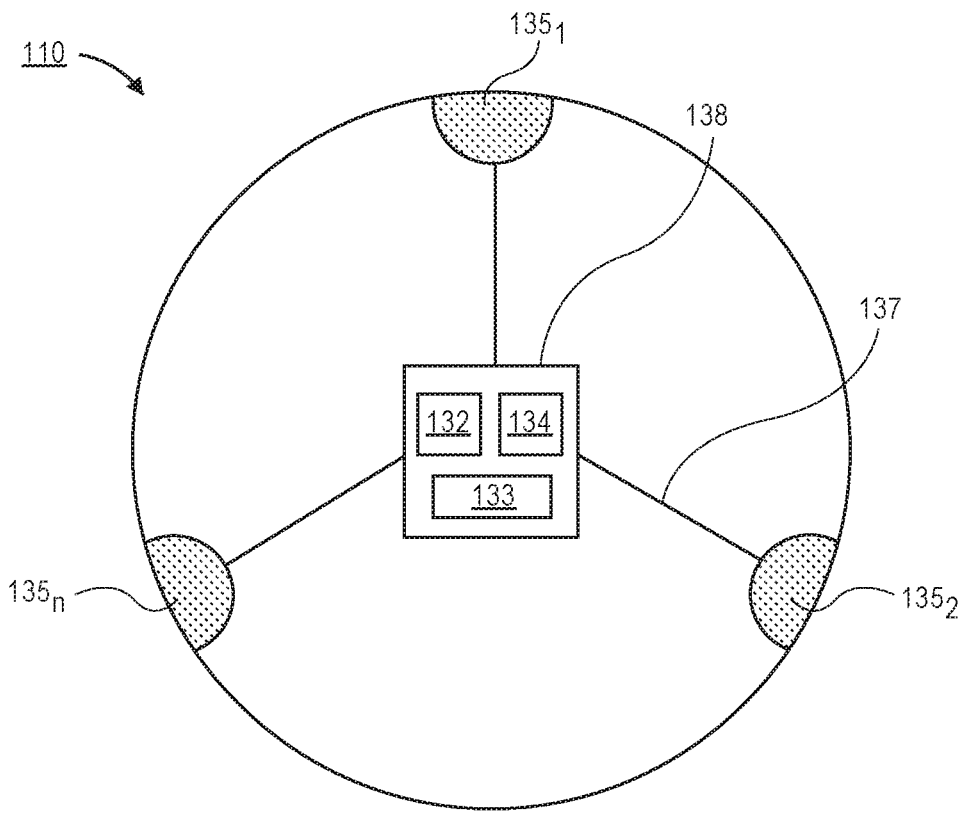
FIG. 1A is a plan view illustration of a sensor wafer with edge sensors, in accordance with an embodiment.

Referring now to FIG. 1A, a plan view illustration of a sensor wafer 110 with a plurality of edge sensor regions $135_1$-$135_n$ is shown, in accordance with an embodiment. In an embodiment, the edge sensor regions 135 are distributed around the perimeter of the sensor wafer 110. Each sensor region 135 comprises one or more outward facing sensors. In an embodiment, the sensors in the sensor region 135 may be used to measure the gap between the edge of the sensor wafer 110 and the process kit (not shown) that encircles the sensor wafer 110. The one or more sensors in the edge sensor regions 135 may be capacitive sensors. In a particular embodiment, the edge sensor regions 135 may comprise self-referencing capacitive sensors.

In the illustrated embodiment, three edge sensor regions 135 are shown. However, it is to be appreciated that one or more edge sensor regions 135 may be used to determine when the top surface of the process kit is substantially coplanar with a top surface of the sensor wafer 110, as will be described in greater detail below.

In an embodiment, each of the edge sensor regions 135 may be communicatively coupled to a computing module 138 on the sensor wafer 110 with traces 137. In an embodiment, the computing module 138 may comprise one or more of a power source 132 (e.g., a battery), a processor/memory 134 (e.g., circuitry, memory, etc. for implementing and/or storing measurements made with the edge sensor regions 135), and a wireless communication module 133 (e.g., Bluetooth, WiFi, etc.). In an embodiment, computing module 138 may be embedded in the sensor wafer 110. Additionally, while shown in the center of the sensor wafer 110, it is to be appreciated that the computing module 138 may be located at any convenient location in the sensor wafer 110.

Figure 1B:
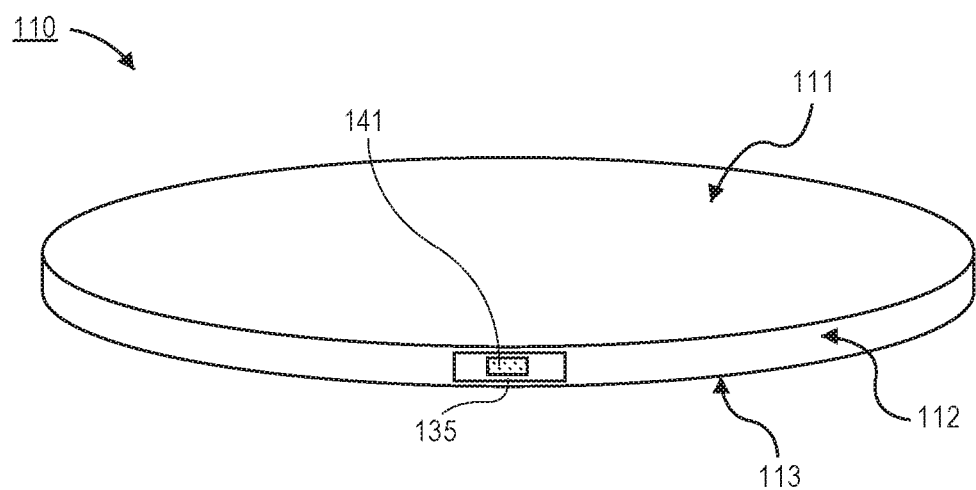
FIG. 1B is a perspective view illustration of a sensor wafer with edge sensors, in accordance with an embodiment.

Referring now to FIG. 1B, a perspective view illustration of a sensor wafer 110 that highlights the details of an exemplary edge sensor region 135 is shown, in accordance with an embodiment. In an embodiment, the sensor wafer 110 may comprise a first surface 111 (e.g., a top surface), a second surface 113 (e.g., a bottom surface), and an edge surface 112 that connects the first surface 111 to the second surface 113. In an embodiment, the edge sensor region 135 may be formed along the edge surface 112.

In a particular embodiment, the edge sensor region 135 may comprise a probe 141. The probes 141 (i.e., the probe in each edge sensor region) may be a self-referencing capacitive probes. That is, an output phase of current supplied to a first probe 141 in a first edge sensor region 135 may be 180 degrees offset from an output phase of current supplied to a second probe 141 in a neighboring second edge sensor region 135. As such, a distance measurement from the edge surface 112 to the surface of the process kit (not shown) may be made without the process kit needing to be grounded. In the illustrated embodiment, the edge sensor region 135 is shown as having a single probe. However, in some embodiments, each edge sensor region 135 may comprise more than one probe 141. While particular reference is made herein to self-referencing capacitive sensors, it is to be appreciated that embodiments disclosed herein include any suitable sensor technology (e.g., laser sensors, optical sensors, etc.).

Figure 2A:
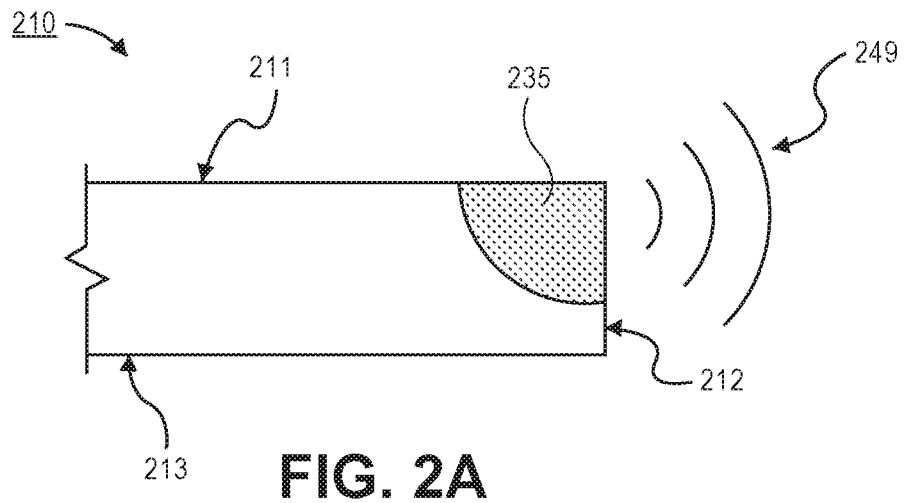
FIG. 2A is a partial cross-sectional illustration of a sensor wafer with an edge sensor, in accordance with an embodiment.

Referring now to FIGS. 2A-2D, exemplary partial cross-sectional illustrations of sensor wafers 210 are shown, in accordance with various embodiments. In FIG. 2A, a partial cross-sectional illustration depicts the sensor region 235 being substantially coplanar with the edge surface 212. In an embodiment, the sensor region 235 emits an electric field 249 from the edge surface 212 so that the sensors may measure a gap between the edge surface 212 and a surface of the process kit.

Figure 2B:
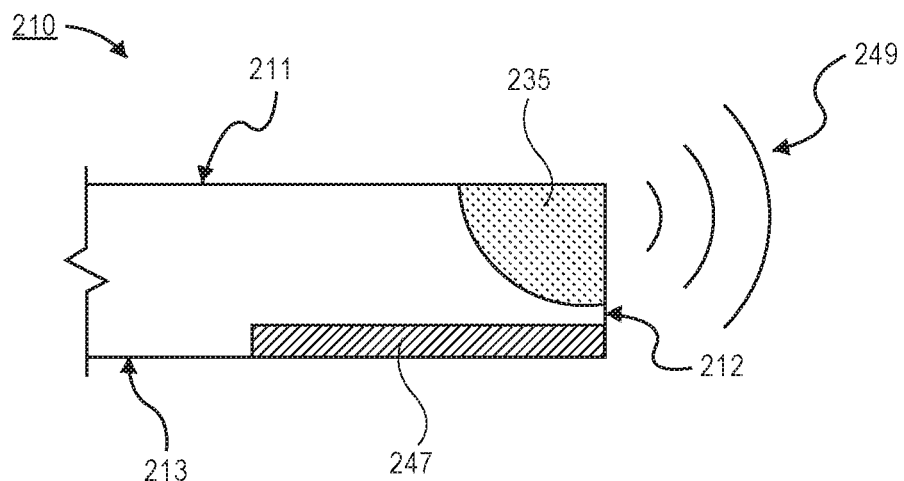
FIG. 2B is a partial cross-sectional illustration of a sensor wafer with an edge sensor and an electric field guard, in accordance with an embodiment.

Referring now to FIG. 2B, a partial cross-sectional illustration of a sensor wafer 210 with a an electric field guard 247 is shown, in accordance with an embodiment. In an embodiment, the electric field guard 247 may be a conductive layer that is formed between a bottom surface 213 of the sensor wafer 210 and the edge sensor region 235. The electric field 249 of the edge sensor region 235 may be modified by the electric field guard 247. Particularly, the electric field guard 247 may modify the electric field 249 of the edge sensor region 235 so that it extends laterally out from the edge surface 212 towards the process kit. Accordingly, the electric field guard 247 prevents the sensors in the edge sensor region 235 from detecting objects below the sensor wafer 210 that may provide erroneous readings.

Figure 2C:
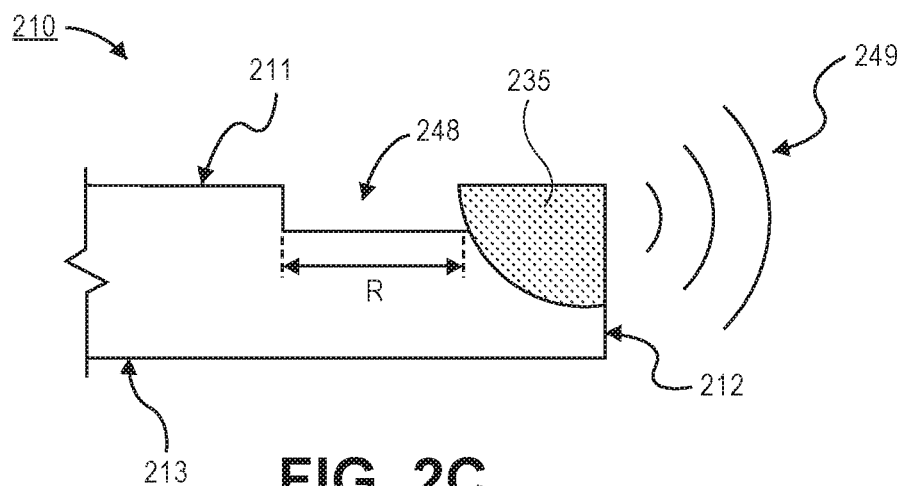
FIG. 2C is a partial cross-sectional illustration of a sensor wafer with an edge sensor and a top surface recess, in accordance with an embodiment.

Referring now to FIG. 2C, a partial cross-sectional illustration of a sensor wafer 210 with a top surface recess 248 is shown, in accordance with an embodiment. In an embodiment, the top surface recess 248 may be formed into the first surface 211 immediately adjacent to the sensor region 235. The top surface recess 248 may be made to prevent the sensors of the sensor region 235 from sensing the top surface 211 and providing erroneous readings. In an embodiment, the top surface recess 248 may extend back a distance R. For example the distance R may be approximately equal to a maximum sensing distance of the edge sensing region 235. In an embodiment, the distance R may be 2.0 mm or less, or 1.0 mm or less.

Figure 2D:
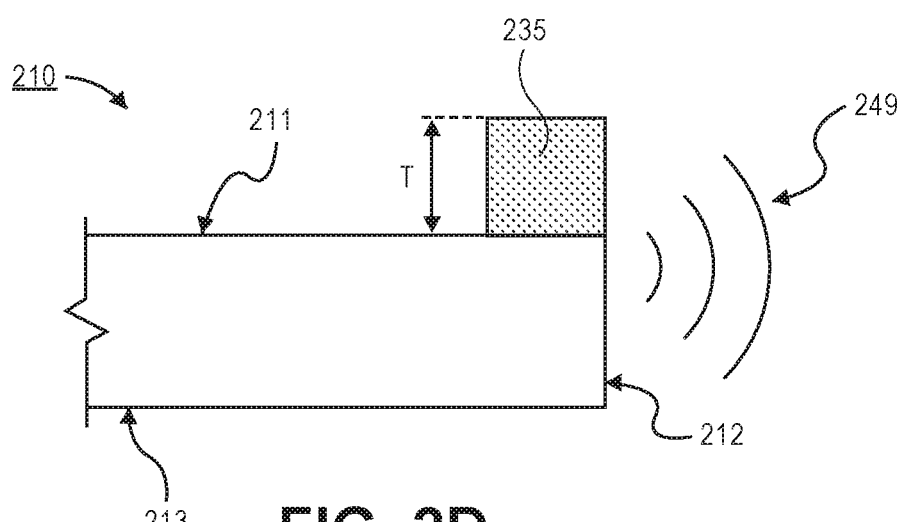
FIG. 2D is a partial cross-sectional illustration of a sensor wafer with an edge sensor formed over a top surface of the sensor wafer, in accordance with an embodiment.

Referring now to FIG. 2D, a partial cross-sectional illustration of a sensor wafer 210 with the sensor region 235 being formed over the first surface 211 of the sensor wafer 210 is shown, in accordance with an embodiment. Positioning the sensor region 235 above the sensor wafer 210 may be beneficial for when a top surface of the process kit needs to be positioned above the top surface of the device wafers. In an embodiment, the sensor region 235 may have a thickness T that does not significantly alter the form factor of the sensor wafer 210. For example the thickness T may be less than 5 mm, less than 2 mm, less than 1 mm, or less than 0.5 mm. Accordingly, the sensor wafer 210 may still pass through any load locks in a processing tool.

Figure 3A:
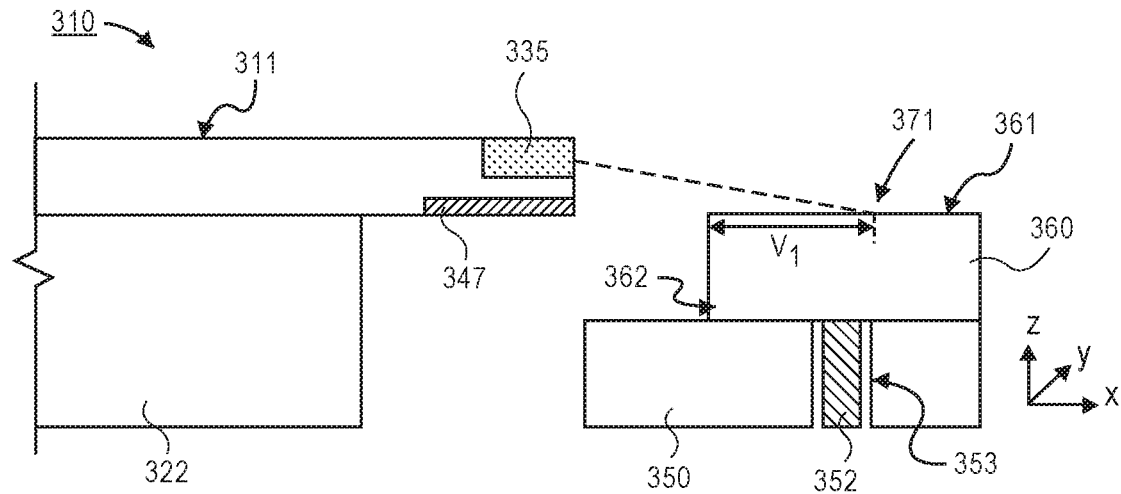
FIG. 3A is a cross-sectional illustration of a sensor wafer measuring the gap distance between the sensor wafer and a fully recessed process kit, in accordance with an embodiment.
Figure 3B:
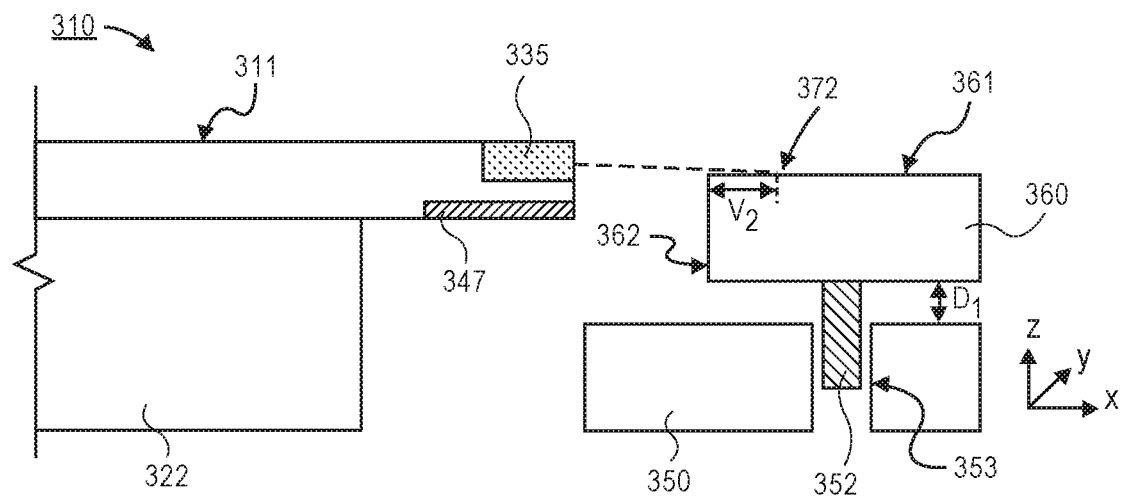
FIG. 3B is a cross-sectional illustration of the sensor wafer and process kit of FIG. 3A after the process kit is displaced vertically a first distance by a lift pin, in accordance with an embodiment.
Figure 3C:
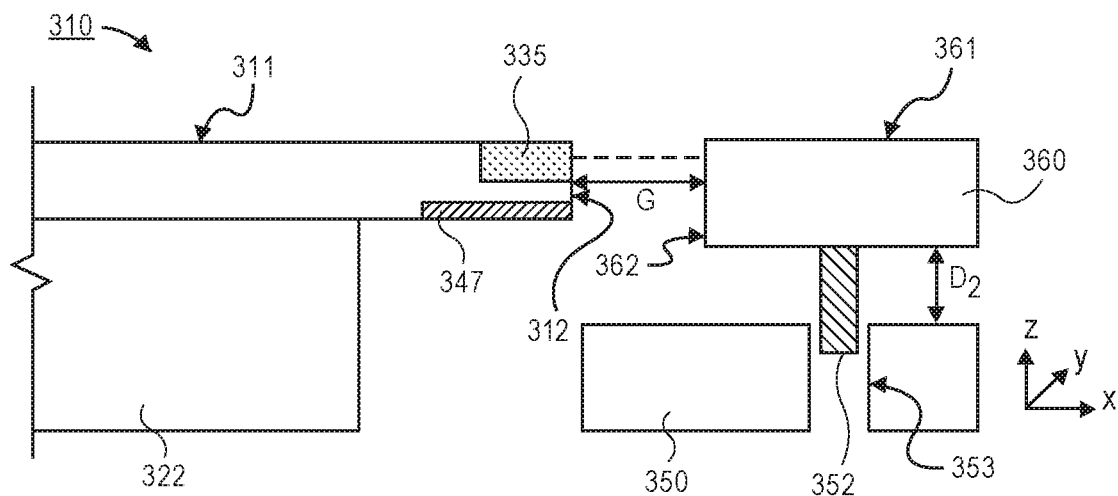
FIG. 3C is a cross-sectional illustration of the sensor wafer and process kit of FIG. 3B after the process kit is displaced vertically a second distance so that a top surface of the process kit and a top surface of the sensor wafer are substantially coplanar, in accordance with an embodiment.

Referring now to FIG. 3A-3C, a series of cross-sectional illustrations depict a process for calibrating a processing tool so that a top surface 361 of a process kit 360 is substantially coplanar with the first (i.e., top) surface 311 of the sensor wafer 310.

Referring now to FIG. 3A, a cross-sectional illustration of a portion of a sensor wafer 310 that is supported by a support surface 322 is shown, in accordance with an embodiment. In an embodiment, the sensor wafer 310 may be any sensor wafer with one or more edge sensor regions 335. For example, any of the sensor wafers described above with respect to FIGS. 1A-1D may be used in accordance with various embodiments. In the particular embodiment illustrated in FIG. 3A, the sensor wafer 310 comprises an edge sensor region 335 and an electric field guard 347, though embodiments are not limited to such configurations. In an embodiment, the sensor wafer 310 may have a form factor that is substantially similar to the form factor of wafers to be processed in the processing tool. For example, the sensor wafer 310 may have a diameter that is 300 mm and a thickness that is less than 1 mm. In an embodiment, the support surface 322 may be an electrostatic chuck (ESC) or any other suitable surface for supporting and securing the sensor wafer 310.

In an embodiment, the support surface 322 may be surrounded by a process kit support 350 on which the process kit 360 rests. The support surface 322 may comprise a plurality of lift pins 352 that are set into openings 353 in the process kit support 350. In an embodiment the lift pins 352 may be underneath the process kit 360. As the lift pins 352 are extended with an actuator (not shown) the process kit is displaced in the Z-direction.

In FIG. 3A, the lift pins 352 are fully retracted so that the process kit rests entirely on the process kit support surface 350. In such embodiments, the top surface 361 of the process kit 360 may be below the top surface 311 of the sensor wafer 310. Accordingly, as the edge sensor region 335 senses outward towards the process kit 360, the edge sensor regions detects a first point 371 on the top surface 361 of the process kit 360. In an embodiment, the first point 371 may be a first distance $V_1$ from an interior surface 362 of the process kit 360.

Referring now to FIG. 3B, a partial cross-sectional illustration after the lift pins are extended and the process kit 360 is raised a distance $D_1$ in the Z-direction is shown, in accordance with an embodiment. As shown, the edge sensor region 335 now senses a second point 372 on the top surface 361 of the process kit 360. In an embodiment, the second point 372 may be a second distance $V_2$ from the interior edge of the process kit 360. As those skilled in the art will appreciate, the displacement of the process kit 360 a distance $D_1$ in the Z-direction results in the second distance $V_2$ being smaller than the first distance $V_1$ shown in FIG. 3A. That is, the second point 372 is closer to the interior surface 362 of the process kit 360 than the first point 371.

Referring now to FIG. 3C, a partial cross-sectional illustration after the process kit is displaced a second distance $D_2$ in the Z-direction is shown, in accordance with an embodiment. As shown, the displacement $D_2$ results in a top surface 361 of the process kit 360 being substantially coplanar with a top surface 311 of the sensor wafer. At this point, the edge sensor region 335 begins to measure a true gap G between an edge surface 312 of the sensor wafer 310 and the edge surface 362 of the process kit 360. Now that the view of the edge sensor region 335 is entirely blocked by the process kit 360 subsequent readings from the edge sensor region 335 will be substantially uniform as the process kit is displaced further in the Z-direction.

Figure 4:
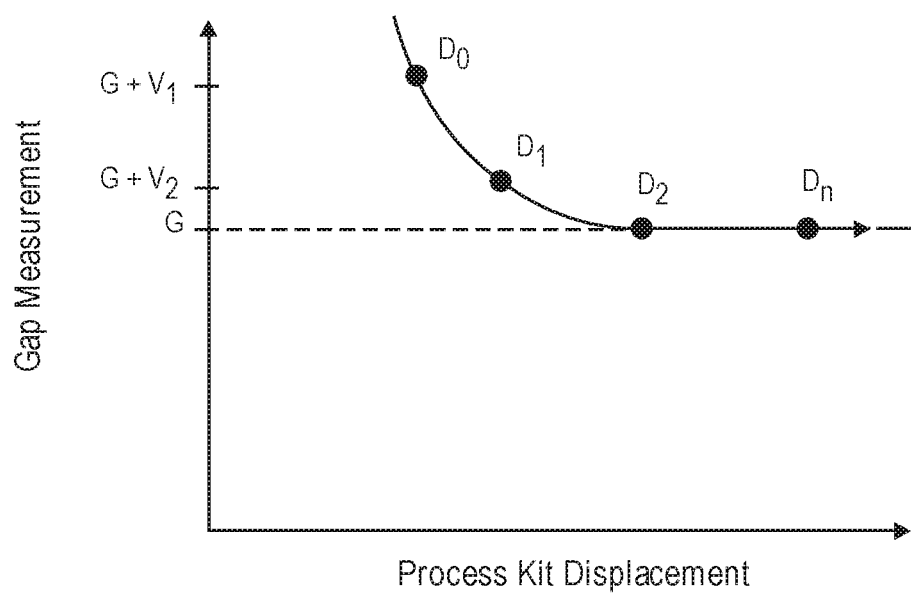
FIG. 4 is a graph that illustrates the measured gap distance relative to the vertical displacement of the process kit, in accordance with an embodiment.

For example, FIG. 4 shows a graph of the gap measurement with respect to the process kit displacement in the Z-direction. As shown, when the process kit 360 is at $D_0$ (i.e., when the process kit 360 is resting on the process kit support surface 350, as shown in FIG. 3A) the measured gap is equivalent to the true gap G plus the first distance $V_1$. When the process kit 360 is displaced a distance $D_1$ (i.e., as shown in FIG. 3B), the measured gap is equivalent to the true gap G plus the second distance $V_2$. When the process kit 360 is displaced a distance $D_2$ (i.e., as shown in FIG. 3C), the measured gap is equivalent to the true gap G. Subsequent measurements (e.g., $D_n$) will persist at the true gap G since the interior surface 362 of the process kit 360 is substantially vertical and the edge sensor "sees" an unchanging surface as the process kit is further advanced in the Z-direction. As used herein, it is to be appreciated that the sensor may not literally "see" surfaces. For example, with a capacitive sensor such as those described herein, a voltage measurement of conductive pads of the sensor may be correlated to the distance between the surface that is "seen" and the sensor. Once successive gap measurements return the same value (i.e., when the slope of the line of the gap measurement distance versus process kit displacement is zero), it can be deduced that the displacement (D) of the first instance of the repeated measurement value is the displacement where the top surface of the sensor wafer 310 is substantially coplanar with the top surface 361 of the process kit 360.

Figure 5:
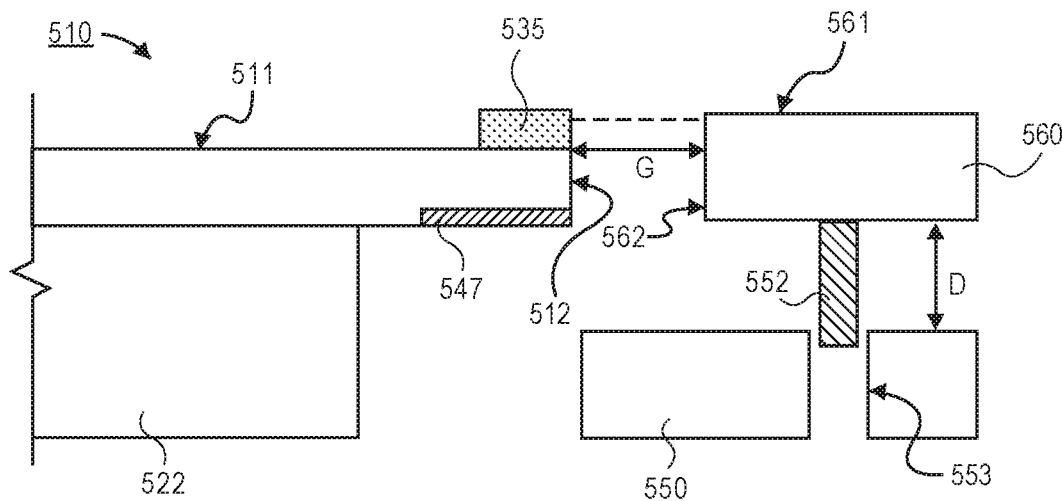
FIG. 5 is a cross-sectional illustration of a sensor wafer with an edge sensor above the top surface of the sensor wafer and a process kit that is raised above the sensor wafer, in accordance with an embodiment.

When the top surface of the process kit needs to be above the top surface of device wafers, the edge sensor region may be placed above the first (i.e., top) surface of the sensor wafer. Such an embodiment is shown in FIG. 5. As shown, the sensor region 535 is placed above the first surface 511 of the sensor wafer 510. Accordingly, the sensor region 535 does not "see" the interior surface 562 of the process kit 560 until the process kit 560 is displaced a distance D that results in the top surface 561 of the process kit 560 being above a top surface 511 of the sensor wafer.

Figure 6:
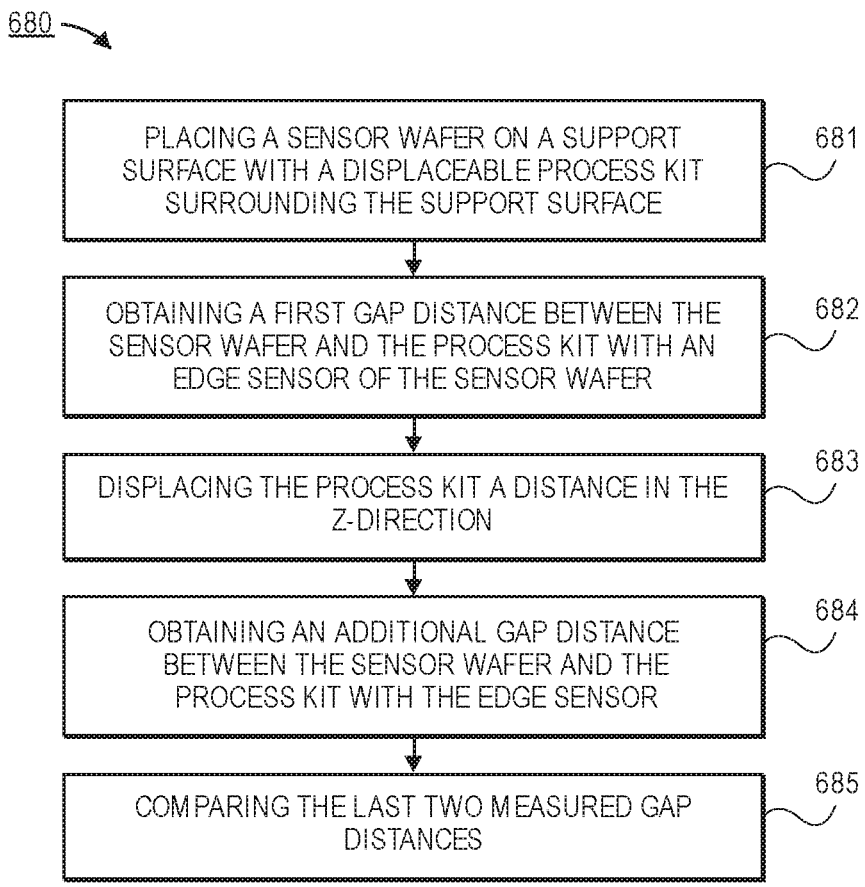
FIG. 6 is a process flow diagram of a process for positioning a process kit relative to a sensor wafer, in accordance with an embodiment.

Referring now to FIG. 6, a process flow diagram of a process 680 for aligning a top surface of a process kit with a top surface of a sensor wafer is shown, in accordance with an embodiment.

In an embodiment, process 680 may begin with operation 681 which comprises placing a sensor wafer on a support surface with a displaceable process kit surrounding the support surface. In an embodiment, the sensor wafer may be any sensor wafer, such as those described herein that include one or more edge sensor regions. In an embodiment, the sensor wafer may have substantially the same form factor as wafers processed in the processing tool. As such, the sensor wafer may be placed on the support surface (e.g., an electrostatic chuck) with a wafer handling robot. In an embodiment, the process kit may rest on a process kit support surface. The process kit support surface may comprise a plurality of lift pins for displacing the process kit in the Z-direction.

In an embodiment, process 680 may continue with operation 682 which comprises obtaining a first gap distance between the sensor wafer and the process kit with an edge sensor of the sensor wafer. In an embodiment, the edge sensor may be a self-referencing capacitive sensor. In an embodiment, a top surface of the process kit may be below a top surface of the sensor wafer. As such, the first gap distance may be made by sensing a first point along the top surface of the process kit instead of sensing an interior edge of the process kit.

In an embodiment, process 680 may continue with operation 683 which comprises displacing the process kit a distance in the Z-direction. In an embodiment, the process kit may be displaced in the Z-direction with lift pins in the process kit support surface.

In an embodiment, process 680 may continue with operation 684 which comprises obtaining an additional gap distance between the sensor wafer and the process kit with the edge sensor.

In an embodiment, process 680 may continue with operation 685 which comprises comparing the last two measured gap distances. In an embodiment where the last two measured gap distances are different, process 680 may repeat operations 683-685. For example, process 680 may repeat the operations of displacing the process kit in the Z-direction, obtaining an additional gap distance, and comparing the last two measured gap distances (e.g., comparing a third gap distance to a second gap distance, comparing a fourth gap distance to the third gap distance, etc.). In an embodiment where the last two measured gap distances are the same, process 680 may end since the top surface of the process kit is now substantially coplanar with a top surface of the sensor wafer.

Figure 7:
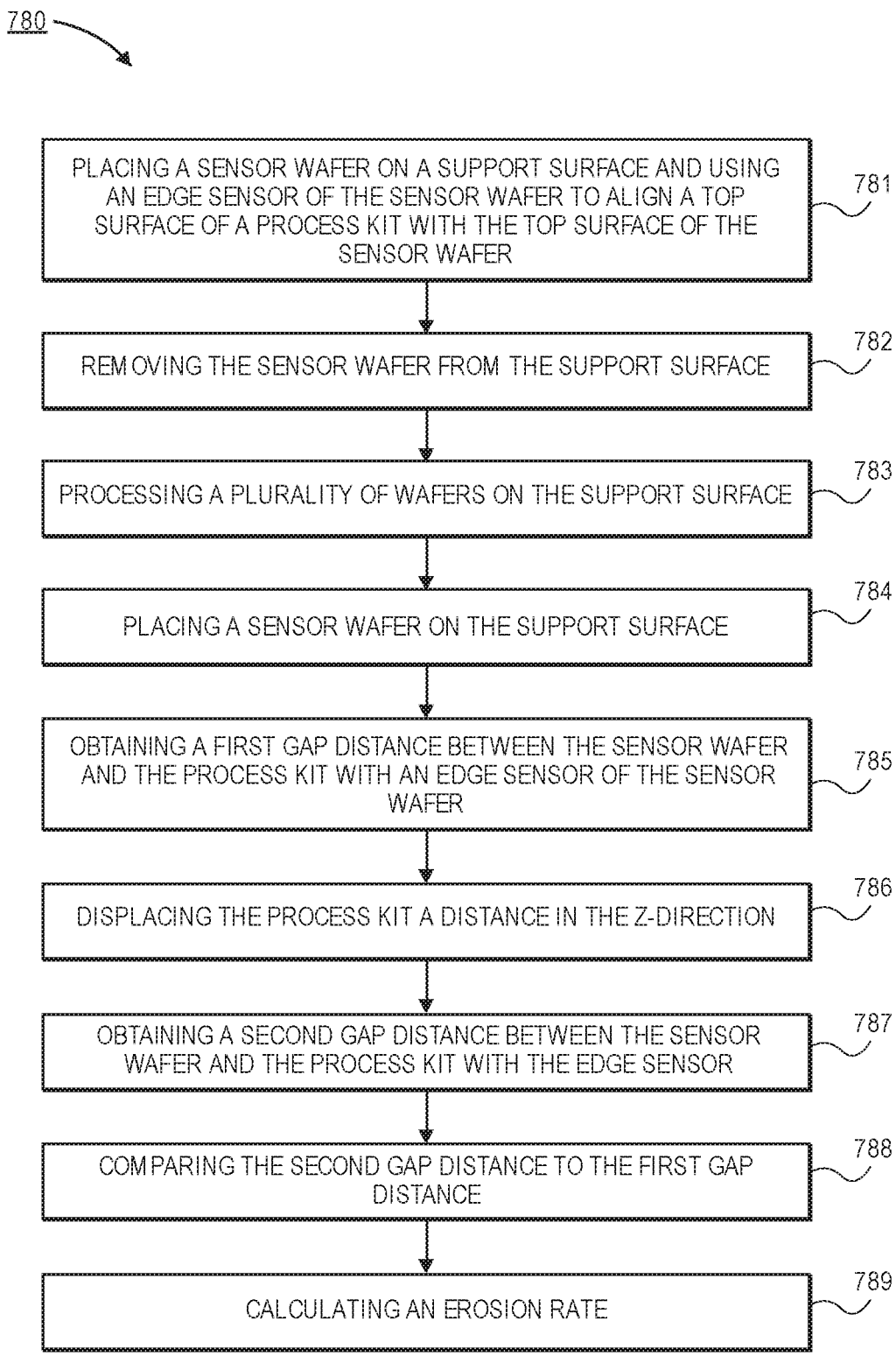
FIG. 7 is a process flow diagram of a process for determining the erosion rate of a process kit for a given processing operation, in accordance with an embodiment.

Referring now to FIG. 7, a process flow diagram of a process 780 for determining an amount of erosion of a process kit is shown, in accordance with an embodiment.

In an embodiment, process 780 begins with operation 781 which comprises placing a sensor wafer on a support surface and using an edge sensor of the sensor wafer to align a top surface of a process kit with a top surface of the sensor wafer. The process for aligning the top surface of the process kit with the top surface of the sensor wafer may be substantially similar to the process 680 described above with respect to FIG. 6.

In an embodiment, process 780 may continue with operation 782 which comprises removing the sensor wafer from the support surface. In an embodiment, the sensor wafer may be removed with a wafer handling robot or the like.

In an embodiment, process 780 may continue with operation 783 which comprises processing a plurality of wafers on the support surface. In an embodiment processing the plurality of wafers may comprise any semiconductor manufacturing process. For example, the process may include an etching process. In an embodiment, the processing may result in erosion of the process kit. In an embodiment, the plurality of wafers may comprise tens of wafers, hundreds of wafers, or thousands of wafers.

In an embodiment, process 780 may continue with operation 784 which comprises placing a sensor wafer on the support surface. In an embodiment, the sensor wafer may be the same sensor wafer used in operation 781. However, it is to be appreciated that a different sensor wafer may also be used in some embodiments.

In an embodiment, process 780 may continue with operation 785 which comprises obtaining a first gap distance between the sensor wafer and the process kit with an edge sensor of the sensor wafer. In an embodiment, the erosion may result in the top surface of the process kit being below the top surface of the sensor wafer. Accordingly, the first gap distance may sense a top surface of the process kit instead of an interior surface of the process kit.

In an embodiment, process 780 may continue with operation 786 which comprises displacing the process kit a distance in the Z-direction. In an embodiment, the process kit may be displaced with lift pins in a process kit support surface.

In an embodiment, process 780 may continue with operation 787 which comprises obtaining an additional gap distance between the sensor wafer and the process kit with the edge sensor.

In an embodiment, process 780 may continue with operation 788 which comprises comparing the last two measured gap distances. In an embodiment where the last two measured gap distances are different, process 780 may repeat operations 786-788. For example, process 780 may repeat the operations of displacing the process kit in the Z-direction, obtaining an additional gap distance, and comparing the last two measured gap distances (e.g., comparing a third gap distance to a second gap distance, comparing a fourth gap distance to the third gap distance, etc.).

In an embodiment where the last two measured gap distances are the same, process 780 may continue with operation 789 which comprises calculating an erosion rate. In an embodiment, the erosion rate may be calculated by determining a total displacement of the process kit in the Z-direction and dividing by the number of wafers in the plurality of wafers that were processed in operation 783. As such, the erosion rate may be expressed in terms of erosion distance per number of wafers processed. In an additional embodiment, the erosion rate may be calculated by determining the total displacement of the process kit and dividing by the time taken to process the plurality of wafers. In such an embodiment, the erosion rate may be expressed as erosion rate per minute of processing.

In an embodiment, the erosion rate may be stored in a database for future use. For example, the erosion rate may be stored and subsequent processing may automatically displace the process kit in order to account for expected erosion. As such, further measurements with the sensor wafer may not be necessary and processing tool throughput capacity may be increased.

Figure 8:
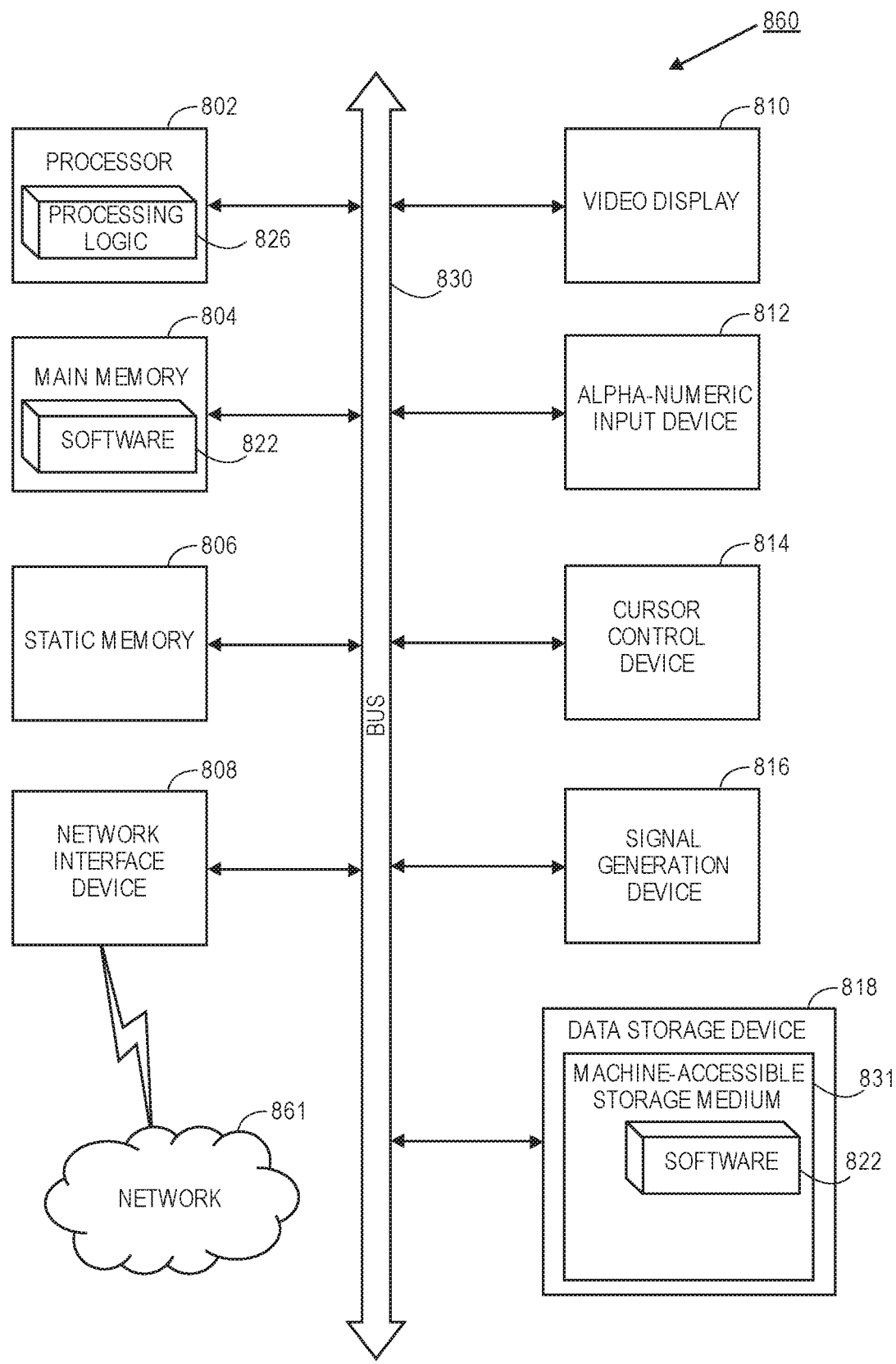
FIG. 8 illustrates a block diagram of an exemplary computer system that may be used in conjunction with processes that include measuring a relationship of a sensor wafer with respect to a process kit, in accordance with an embodiment.

Referring now to FIG. 8, a block diagram of an exemplary computer system 860 of a processing tool is illustrated in accordance with an embodiment. In an embodiment, the computer system 860 may be used to implement one or more processes such as processes 680 and 780. In an embodiment, computer system 860 is coupled to and controls processing in the processing tool. Computer system 860 may be connected (e.g., networked) to other machines in a network 861 (e.g., a Local Area Network (LAN), an intranet, an extranet, or the Internet). Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 861 via the system network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of calibrating a processing chamber, comprising:
    placing a sensor wafer onto a support surface in the processing chamber, wherein a process kit that is displaceable in a Z-direction is positioned around the support surface;
    measuring a first gap distance between the sensor wafer and the process kit with a sensor on an edge surface of the sensor wafer;
    displacing the process kit in the Z-direction; and
    measuring an additional gap distance between the sensor wafer and the process kit.

2. The method of claim 1, further comprising:
    comparing the additional gap distance to the first gap distance.

3. The method of claim 2, further comprising:
    removing the sensor wafer from the support surface when the first gap distance is equal to the additional gap distance.

4. The method of claim 2, further comprising:
    repeating the operations of displacing the process kit in the Z-direction and measuring the additional gap distance until successive measurements of the additional gap distance are equal to each other.

5. The method of claim 1, wherein the sensor is a capacitive sensor.

6. The method of claim 5, wherein the capacitive sensor is a self-referencing capacitive sensor.

7. The method of claim 6, wherein the capacitive sensor comprises a first pad and a second pad, and wherein current supplied to the first pad has an output phase that is 180 degrees from an output phase of current supplied to the second pad.

8. The method of claim 5, wherein the capacitive sensor extends above a top surface of the sensor wafer.

9. A method for measuring erosion of a process kit, comprising:
- placing a sensor wafer on a support surface in a processing tool;
- aligning a top surface of the process kit surrounding the support surface to a top surface of sensor wafer using sensors on the sensor wafer;
- removing the sensor wafer from the support surface;
- processing one or more device substrates in the processing tool;
- placing a sensor wafer on the support surface;
- measuring a gap distance between the sensor wafer and the process kit with a sensor on an edge surface of the sensor wafer;
- displacing the process kit in a Z-direction; and
- measuring the gap distance between the sensor wafer and the process kit a second time; and
- repeating the operations of displacing the process kit and measuring the gap distance until successive measurements of the gap distance are equal to each other.

10. The method of claim 9, further comprising:
calculating a total displacement in the Z-direction of the process kit.

11. The method of claim 10, further comprising:
calculating an erosion rate from the total displacement in the Z-direction of the process kit and a number of device substrates that were processed.

12. The method of claim 11, further comprising:
storing the erosion rate in a database.

13. The method of claim 9, wherein the sensor is a capacitive sensor.

14. The method of claim 13, wherein the capacitive sensor is a self-referencing capacitive sensor.

15. The method of claim 14, wherein the capacitive sensor comprises a first pad and a second pad, and wherein current supplied to the first pad has an output phase that is 180 degrees from an output phase of current supplied to the second pad.

16. The method of claim 13, wherein the capacitive sensor extends above the top surface of the sensor wafer.

* * * * *